(12) United States Patent
Sample et al.

(10) Patent No.: US 6,317,367 B1
(45) Date of Patent: *Nov. 13, 2001

(54) FPGA WITH ON-CHIP MULTIPORT MEMORY

(75) Inventors: Stephen P. Sample, Saratoga, CA (US); Michael R. Butts, Portland, OR (US); Kevin A. Norman, Belmont, CA (US); Rakesh H. Patel; Chao Chiang Chen, both of Cupertino, CA (US)

(73) Assignees: Altera Corporation, San Jose, CA (US); Quickturn Design Systems, Mountain View, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/748,088

(22) Filed: Dec. 21, 2000

Related U.S. Application Data (60) Continuation of application No. 09/405,376, filed on Sep. 24, 1999, which is a division of application No. 09/298,890, filed on Apr. 23, 1999, now Pat. No. 6,011,730, which is a continuation of application No. 08/895,516, filed on Jul. 16, 1997, now Pat. No. 6,011,744.

(51) Int. Cl.[7] ........................................................ G11C 7/00
(52) U.S. Cl. ................................ 365/189.08; 365/189.02; 365/189.05; 326/37; 326/39
(58) Field of Search .......................... 365/189.08, 189.05, 365/189.02, 190, 194, 230.03, 230.05, 52; 326/37, 38, 39, 41, 42

(56) References Cited

U.S. PATENT DOCUMENTS

| | | | |
|---|---|---|---|
| 6,011,730 | * | 1/2000 | Sample et al. .................. 365/189.05 |
| 6,011,744 | * | 1/2000 | Sample et al. .................. 365/230.03 |

* cited by examiner

*Primary Examiner*—Tan T. Nguyen
(74) *Attorney, Agent, or Firm*—Townsend and Townsend and Crew LLP (57) ABSTRACT

An integrated circuit for implementing reconfigurable logic, such as a field programmable gate array ("FPGA"), as described herein has multiple blocks of multiported memory. The memory has a plurality of read ports and a plurality of write ports. Each port of the multiported memory can be configured with a width and depth that is independent and separate from the width and depth of the other ports. The memory also includes a port for taking a synchronous snapshot of the contents of the memory or for loading the memory to an initial state. The memory shares routing lines used by a low level logic element thereby alleviating the need to add routing lines to an interconnect network just to satisfy the memory requirements.

128 Claims, 8 Drawing Sheets

| Source Data Bit # | Memory Bit 0 | Memory Bit 1 | Memory Bit 2 | Memory Bit 3 | Memory Bit 4 | Memory Bit 5 | Memory Bit 6 | Memory Bit 7 |
|---|---|---|---|---|---|---|---|---|
| Bit 7 | | | | | | | | S8 |
| Bit 6 | | | | | | | S8 | |
| Bit 5 | | | | | | S8 | | |
| Bit 4 | | | | | S8 | | | |
| Bit 3 | | | | S8,S40 | | | | S44 |
| Bit 2 | | | S8,S40 | | | | S44 | |
| Bit 1 | | S8,S40 S20 | | S22 | | S44,S24 | | S26 |
| Bit 0 | S8,S40 S20,S10 | S11 | S22,S12 | S13 | S44,S24 S14 | S15 | S26,S16 | S17 |

FIG. 7

| Destination Data Bit # | Memory Bit 0 | Memory Bit 1 | Memory Bit 2 | Memory Bit 3 | Memory Bit 4 | Memory Bit 5 | Memory Bit 6 | Memory Bit 7 |
|---|---|---|---|---|---|---|---|---|
| Bit 7 | | | | | | | | S8 |
| Bit 6 | | | | | | | S8 | |
| Bit 5 | | | | | | S8 | | |
| Bit 4 | | | | | S8 | | | |
| Bit 3 | | | | S8,S40 | | | | S44 |
| Bit 2 | | | S8,S40 | | | | S44 | |
| Bit 1 | | S8,S40 S20 | | S22 | | S44,S24 | | S26 |
| Bit 0 | S8,S40 S20,S10 | S11 | S22,S12 | S13 | S44,S24 S14 | S15 | S26,S16 | S17 |

FPGA WITH ON-CHIP MULTIPORT MEMORY

CROSS-REFERENCES TO RELATED APPLICATIONS

This is a continuation application of U.S. patent application Ser. No. 09/405,376, filed Sep. 24, 1999, which is a divisional application of U.S. patent application Ser. No. 09/298,890, filed Apr. 23, 1999 now U.S. Pat. No. 6,011,730, which is a continuation of U.S. patent application Ser. No. 08/895,516, filed Jul. 16, 1997 now U.S. Pat. No. 6,011,744, which are incorporated by reference.

FIELD OF THE INVENTION

The field of the present invention is integrated circuits for implementing reconfigurable logic, such as field programmable gate arrays ("FPGAs"), that are specially designed for emulation systems. In particular, the present invention is directed to a FPGA having multiple blocks of multiported memory and a special port for taking a synchronous snapshot of the contents of the memory or for loading the memory to an initial state.

BACKGROUND OF THE INVENTION

Field programmable gate arrays such as those available from Xilinx, Altera, AT&T and others are widely used for implementing various types of logic functions. FPGAs offer an advantage over mask-programmed gate arrays and discrete logic because the logic functions carried out by an FPGA can be easily reprogrammed to meet the user's objectives.

FPGAs are traditionally structured in a multi-level hierarchy, with simple logic blocks capable of performing the desired logic functions combined together to form more complex blocks, which are then combined to form a complete chip. Designs intended for implementation in FPGAs often include memories. This is especially true in prototyping applications where the designs being prototyped often contain large and complex memories.

Some FPGAs provide a mechanism for implementing small amounts of memory. For example, the Xilinx 4000 series of FPGAs allow the user to implement thirty-two bits of random-access memory ("RAM") for each configurable logic block ("CLB"). RAMs can also be constructed using the flip-flop storage elements in the CLBs. Combining these small RAMs into the larger memories found in real designs, however, is difficult, slow, and consumes much of the FPGA routing and logic resources. This problem is particularly severe when the memory to be implemented has multiple ports, especially multiple write ports which require even greater routing resources to satisfy the memory requirements. Routing of memory outputs additionally should not require a sizable expansion in the routing network. A further drawback of the existing devices is the lack of an easy way to observe the contents of the FPGA memories at a selected point in time or to initialize the memories to a predetermined state. The prior art has not effectively resolved these and other issues.

SUMMARY OF THE INVENTION

A first, separate aspect of the present invention is a memory for an integrated circuit for implementing reconfigurable logic where the memory allows flexible implementation of various types of large and multiported memories inside the integrated circuit.

A second, separate aspect of the present invention is a multiported memory for an integrated circuit for implementing reconfigurable logic.

A third, separate aspect of the present invention is an integrated circuit for implementing reconfigurable logic having a memory whose width and depth are configurable in a tradeoff fashion.

A fourth, separate aspect of the present invention is an integrated circuit for implementing reconfigurable logic, where the integrated circuit includes a multiported memory wherein the width and depth of each port may be configured independently of the width and depth of the other ports.

A fifth, separate aspect of the present invention is an integrated circuit for implementing reconfigurable logic and including a memory, where the memory includes a register that can read the contents of the memory synchronously such that the data read accurately represents a snapshot of the memory contents at a point in time.

A sixth, separate aspect of the present invention is an integrated circuit for implementing reconfigurable logic and including a memory, where the memory includes a register that can load data into the memory so that the memory is loaded to a predetermined state.

A seventh, separate aspect of the present invention is an integrated circuit for implementing reconfigurable logic, where the circuit includes a logic element, an interconnect network and a memory that uses the logic element to access the interconnect network, thereby alleviating the necessity of adding routing lines to the interconnect network just to satisfy the memory requirements.

An eighth, separate aspect of the present invention is an integrated circuit for implementing reconfigurable logic, where the circuit includes a logic element, an interconnect network and a memory that shares some but not all of the routing resources used by the logic element so that the logic element may still perform logic functions.

One exemplary embodiment of the present invention provides a field programmable gate array integrated circuit including a logic element programmably configurable to implement user-defined logic functions, and a configurable memory block coupled to the logic element. The memory is capable of being written to and read from, and has a configurable width and a configurable depth. If the width of the memory is increased, its depth is correspondingly decreased; similarly, if the width is decreased the depth is increased. The memory block includes a write buffer having a plurality of data inputs, a plurality of select lines for selecting one of the plurality of data inputs, a first logic gate having an input coupled to the selected one of the plurality of data inputs, a second logic gate coupled to the select lines, and a third logic gate having an input coupled to an output of the second logic gate.

Another embodiment of the present invention provides a field programmable gate array integrated circuit having a logic element programmably configurable to implement user-defined combinatorial or registered logic functions. Also included are a look-up table providing a look-up table output, and a register coupled to the look-up table output and providing a register output. The look-up table output or the register output may be provided as a logic element output. A memory block to store data is coupled to the logic element output, and the memory block includes a write buffer circuit having at least three data inputs, selectively coupled to a first NOR gate by using at least three select inputs, a first logic gate, which receives the select inputs and provides a first logic gate output to the first NOR gate, and a second NOR gate, which receives the first logic gate output.

BRIEF DESCRIPTION OF THE DRAWINGS

The various objects, features and advantages of the present invention will be better understood by considering the Detailed Description of a Preferred Embodiment which follows together with the drawing Figures, wherein.

DESCRIPTION OF THE SPECIFIC EMBODIMENTS

In the preferred embodiment, an FPGA has eight 1K blocks of memory. Each memory block 10 contains 1024 bits of memory which can be organized into four different combinations of width and depth: (a) 1K bits by 1 bit, (b) 512 by 2, (c) 256 by 4, and (d) 128 by 8. Other memory configurations and combinations of width and depth are certainly possible as well.

Figure 1:
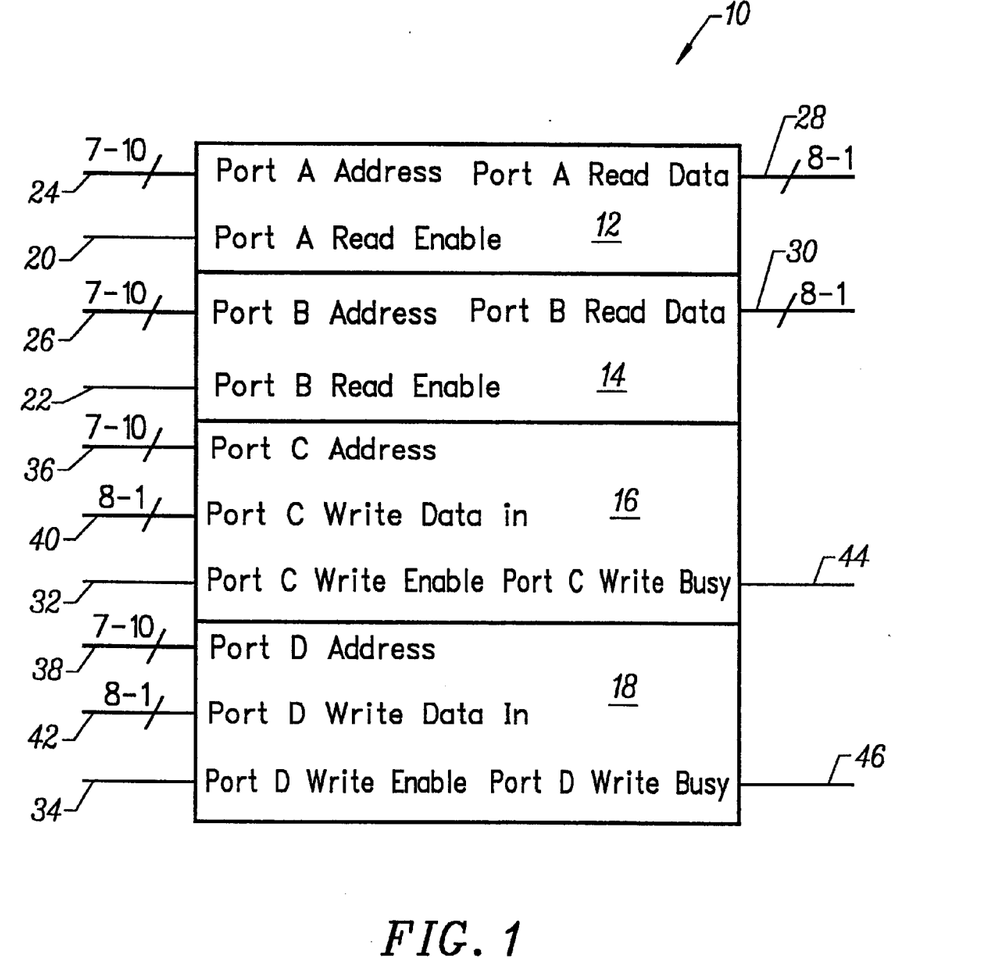
FIG. 1 is a block diagram pinout of a memory block that embodies the present invention.

FIG. 1 illustrates a block diagram pinout of one of the memory blocks 10. Each memory block 10 of the preferred embodiment has two read ports 12, 14 and two write ports 16, 18, although other quantities of read and write ports are also foreseen. Each of the four ports operates independently of one another and may be used simultaneously with other ports. If the implementation of a particular memory does not require the memory block 10 to use two read and two write ports, the memory block 10 can be configured as two independent submemories where each submemory has one read and one write port as long as the number of data bits in a submemory suffices for the particular implementation. The memory width/depth tradeoff can be set independently for each port. For example, it is possible to write into individual bits using the 1K by 1 option on a write port and read out bytes using the 128 by 8 option on a read port. As a further example, one read port can be configured with a width/depth option that is different than the width/depth option for the other read port. The number of address and data lines required for each port varies with the various width/depth options as follows:

|  | 1K×1 | 512×2 | 256×4 | 128×8 |
|---|---|---|---|---|
| Write Port Signals |  |  |  |  |
| Address lines | 10 | 9 | 8 | 7 |
| Data In lines | 1 | 2 | 4 | 8 |
| Write signal line | 1 | 1 | 1 | 1 |
| Write Busy line | 1 | 1 | 1 | 1 |
| Total pins/port | 13 | 13 | 14 | 17 |
| Read Port Signals |  |  |  |  |
| Address lines | 10 | 9 | 8 | 7 |
| Data Out lines | 1 | 2 | 4 | 8 |
| Read Enable line | 1 | 1 | 1 | 1 |
| Total pins/port | 12 | 12 | 13 | 16 |
| Overall Total pins | 50 | 50 | 54 | 66 |

Each of the two read ports 12, 14 has a Read Enable signal 20, 22 respectively. The rising edge of a Read Enable signal 20, 22 samples the read port address from the read address lines 24, 26 and causes data to emerge on the Read Data lines 28, 30 (known as the data-out lines).

Similarly, each of the two write ports 16, 18 has a Write Enable signal 32, 34. The rising edge of the Write Enable signal 32, 34 samples the write port address from the write address lines 36, 38 and data from the Write Data lines 40, 42 respectively. Internal write strobes are internally generated following a rising edge on Write Enable signals 32, 34 by the write buffer circuit shown in FIG. 10 (which is discussed later). Upon receipt of the rising edge of the Write Enable signal 32, 34, the Write Busy line 44, 46 goes high to signify that data is in the process of being written to memory. When the write process is complete, the Write Busy signal 44, 46 returns to low. The duration of the internal write strobes are relatively short so that the user generally need not pay attention to the Write Busy signals. The Write Busy signals 44, 46 are provided for users who want to use a foolproof semaphore for RAM write timing.

Figure 2:
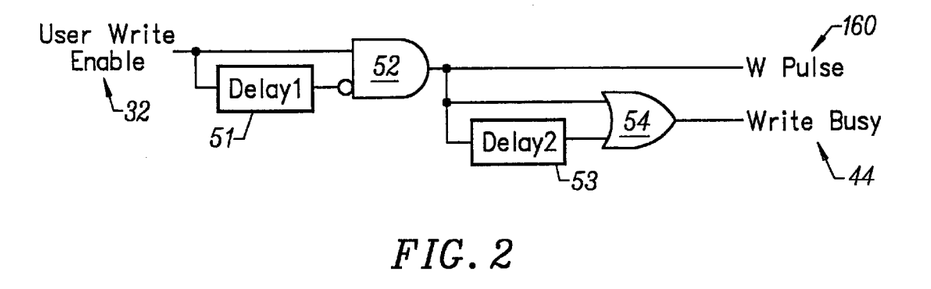
FIG. 2 is a pulse generator circuit schematic that logically represents the delays in generating a Write strobe signal and a Write Busy signal.

FIG. 2 illustrates a pulse generator circuit which generates the write strobe or WPulse signal 160, Write Busy signal 44 and the associated delays. A Write Enable signal 32 from the user generates asynchronously the WPulse signal 160 as well as the Write Busy signal 44. When the Write Enable signal 32 from the user rises from low to active high, the circuit generates a high going pulse of duration "Delay1" (symbolically represented by delay1 element 51 in FIG. 2) which is passed to the memory as WPulse 160. A stretched version of this pulse having a duration of "Delay1"+ "Delay2" is generated by OR gate 54 and is output as Write Busy 44. Delay2 is symbolically represented by delay2 element 53 in FIG. 2. Delay1 and Delay2 are not necessarily equal in duration. The AND gate 52 and OR gate 54 do not actually exist in the memory circuit, but serve only as logical representations of delays.

The write address and the write data must both satisfy a brief setup time and a short hold time with respect to the rising edge of the Write Enable signal. The setup and hold times serve to guarantee that the data is written correctly to memory. Each write port has only one Write Enable signal. The read ports do not require a setup time or hold time because data is read asynchronously out of the memory. Data can be written either synchronously or asynchronously into memory.

Pins from the memory block 10 use the same routing resources as one of the low level logic blocks ("L0s") in the programmable gate array. Each low level L0 logic block consists of thirty-six logic elements ("LEs"). Each LE within a L0 logic block is connected to an X0 interconnect network (also within the L0 logic block) so that each LE can communicate with other LEs. The X0 interconnect network also allows signals to enter or exit the L0 logic block, thereby permitting communication with the next higher level interconnect network (X1) and higher level logic blocks (L1).

Figure 3:
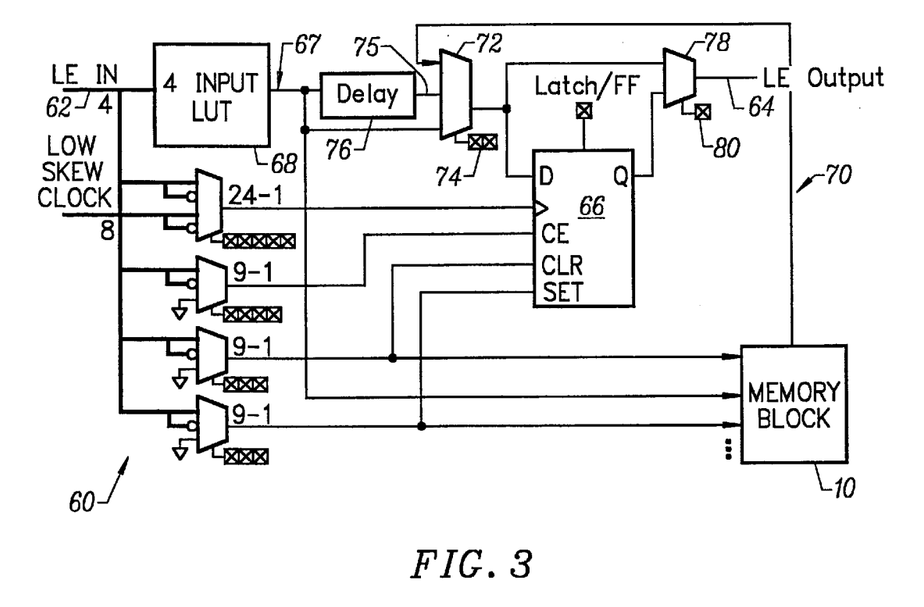
FIG. 3 is a circuit schematic of a logic element with a memory of the preferred embodiment.

FIG. 3 is a circuit diagram of a LE logic element 60 preferably used in a FPGA with the described multiport memory. Each LE 60 has four inputs 62 and one output 64 as well as eight low skew clock inputs. The LE output 64 propagates to an X0 interconnect network which in turn leads either back to a LE input 62 or a higher level interconnect network. In this particular embodiment, pins from eighteen of the thirty-six LEs 60 within an L0 block are utilized by a memory block 10. One input to each LE is reserved to serve as a clock or clock enable to the latch 66 of the LE 60. Latch 66 may alternately perform a flip-flop function if desired, depending on the particular logic function to be implemented by the LE 60. The other three LE inputs 62 are available for connecting to three inputs of the associated memory block 10. The assignment of signals to and from the memory block 10 is done in such a way that the LE inputs 62 may be arbitrarily permutated. That is, a given signal may be carried by any one of the four LE input lines 62. This flexible permutation of LE inputs to the memory block 10 is essential for improving the routability of the L0 logic block.

An LE 60 is connected to a memory block 10 as shown in FIG. 3. In particular, a total of three signals (comprising two of the four LE inputs 62 and the output 67 of the lookup table 68) may propagate to memory block 10. For example, the output 67 of the lookup table 68, the Set input to the latch 66 and the Clear input to the latch 66 may serve as input signals to a memory block 10. Each of these three input signals to the memory block 10 may be used as an address line, a Write Data line, a Write Enable line, a Read Enable line, or another signal of a memory block 10. The Read Data line and Write Busy line are assigned to the output 70 of a memory block 10. The output 70 from a memory block 10 feeds back into the data-in multiplexer 72 of the LE 60. The data-in multiplexer 72 is a three-to-one multiplexer controlled by configuration bits within storage cells 74. The data-in multiplexer 72 sends either the memory output 70, the output 67 of the lookup table 68, or a delayed lookup table output 75 to the D input of the latch 66. If the memory output 70 is not selected, the data-in multiplexer 72 chooses whether to bypass the delay element 76. Delay element 76 serves to insert a programmable delay into the data path within the LE 60 to account for hold time violations. If the memory output 70 is selected by the data-in multiplexer 72, the latch 66 passes the memory output 70 to a data-out multiplexer 78. Data-out multiplexer 78 is a two-to-one multiplexer that is controlled by a configuration bit within storage cell 80. The data-out multiplexer 78 passes the memory output 70 or the output of latch 66 to the X0 interconnect network. By transmitting the memory output 70 through components of the LE 60 (rather than directly) to the X0 interconnect network, additional X0 routing lines are not required to route the memory output. Instead, the memory output 70 simply and advantageously uses part of a LE 60 to reach the X0 interconnect network. Likewise, the memory block 10 can use some of the LE 60's input lines to receive signals and again, additional X0 routing lines are not necessary. Moreover, if only two of the four LE inputs 62 are consumed by the memory function, the remaining LE inputs 62 can still be used by the LE 60 for combinatorial or sequential logic functions. A LE 60 that has some input lines free may still be used to latch data, latch addresses or time multiplex multiple memories to act as a larger memory or a differently configured memory. Therefore, circuit resources are utilized more effectively and efficiently. As shown previously, the memory block 10 requires a maximum of 48 inputs and 18 outputs. Thus, the signals from 18 LEs 60 are sufficient to connect all pins of the memory block 10.

Figure 4:
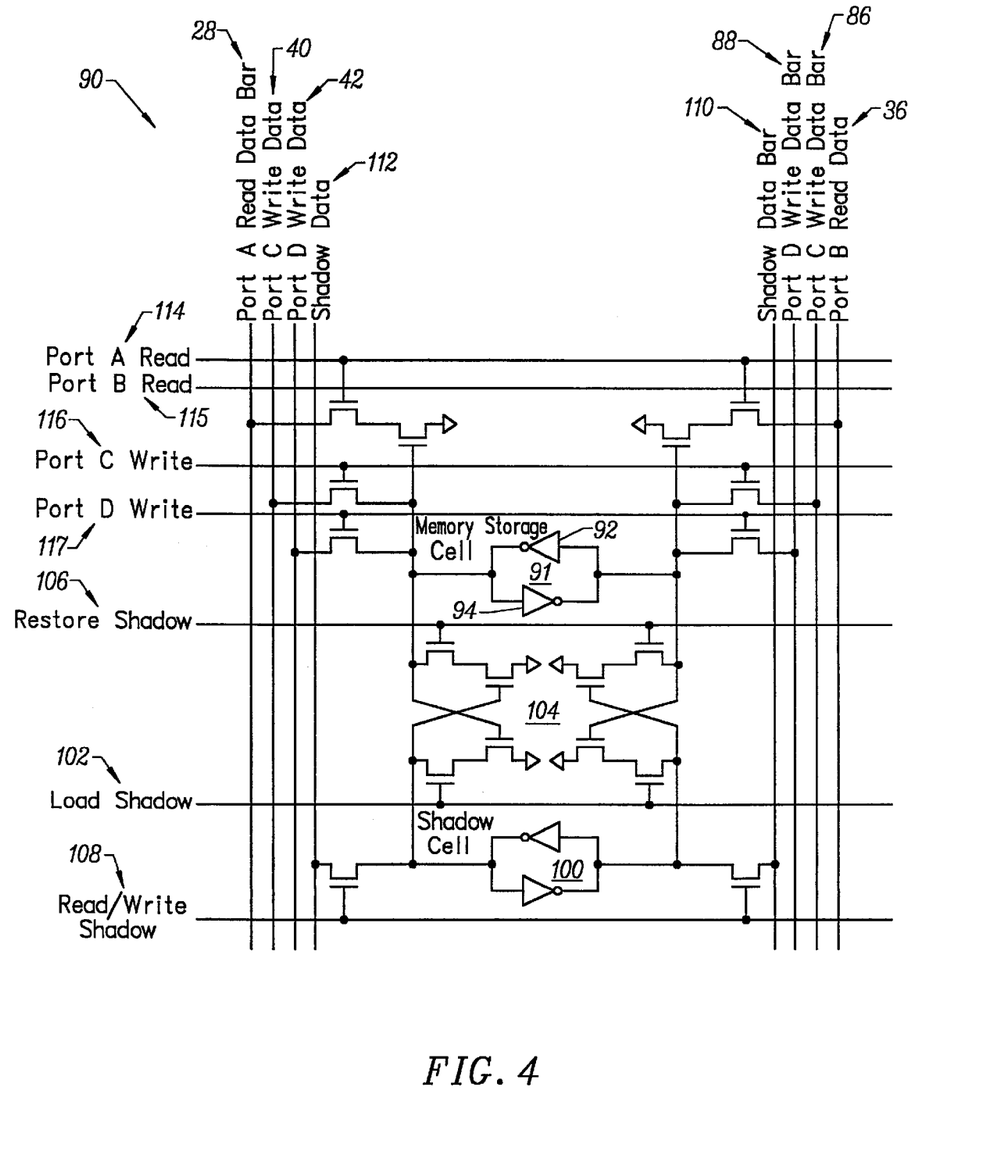
FIG. 4 is a schematic of a memory storage cell and shadow cell of a memory block.

FIG. 4 is a schematic diagram of a memory cell circuit 90 of a multiported memory block 10. The memory cell circuit 90 has a memory storage cell 91 that includes two inverters 92, 94 in a series loop which provides a bistable latch configuration. Read line 114 for read port A 12 controls whether the content of the memory storage cell 91 is read out onto Read Data Bar line 28. Likewise, Read line 115 for read onto Read Data Bar line 28. Likewise, Read line 115 for read port B 14 controls whether the content of the memory storage cell 91 is read out onto Read Data line 30. The desired data appears on the respective Read Data lines which must have been previously at a high level. The Read Data lines may be pulled high through a resistor or alternatively, precharged high. Data is read out of the memory storage cell 91 by placing a high level on a Read Enable line.

The memory storage cell 91 of a memory block 10 can be loaded with data from either of the two write ports 16, 18. Write line 116 (port C) controls whether data on Write Data line 40 and Write Data Bar line 86 is written into memory storage cell 91; Write line 117 (port D) controls whether data on Write Data line 42 and Write Data Bar line 88 is written into memory storage cell 91. As a measure to guarantee correct writing, data is written into memory storage cell 91 only if (1) the Write Enable line is active and (2) either the Write Data line 40 (or 42) is low or the Write Data Bar line 86 (or 88) is low. Write Data line and Write Data Bar line must be complementary. The "Write Data Bar" signal is also known as the "Write Data-" signal. Signals on the Data lines are inverted with respect to the Data-(Data Bar) lines. If the Write Data and Write Data Bar lines are not driven, the memory storage cell 91 may not be written properly, even if the Write Enable line goes high, thereby resulting in an undefined state.

Figure 5:
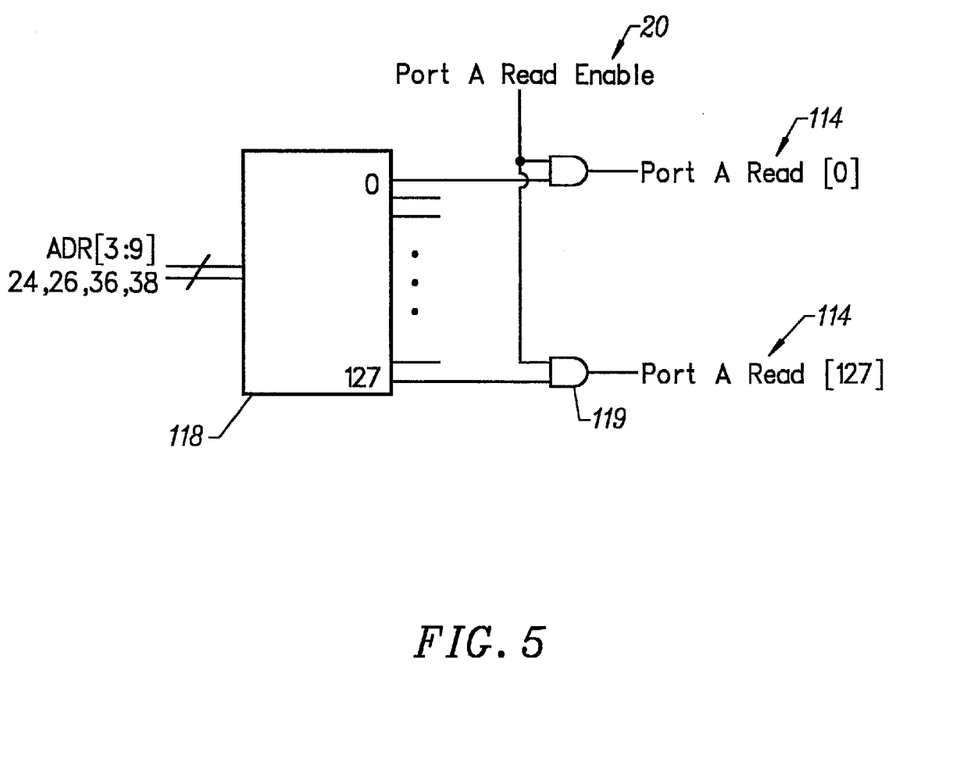
FIG. 5 is a schematic of circuitry for generating Read lines for Port A.

FIG. 5 is a circuit schematic that illustrates circuitry to generate Read lines 114. As shown in the example provided by FIG. 5, the Read and Write lines 114–117 are generated from address lines ADR [3:9] 24, 26, 36, 38 and Enable lines 20, 22, 32, 34. Address lines ADR [3:9] feed into a decoder 118 which pass signals to AND gates 119. AND gates 119 also receive the Enable lines; FIG. 5 shows the example of the Read Enable line 20 being sent to the AND gates 119. 128 Read or Write lines are generated for each port to address the 128 rows of memory cell circuits 90. Other types of decoding circuits may also be used, as would be well understood to those skilled in the art of RAM design.

The memory block 10 is comprised of multiple memory cell circuits 90. Each memory cell circuit 90 has a shadow cell 100. The shadow cells 100 within memory cell circuits 90 together form a shadow register. Each memory block 10 has a port ("shadow port") for accessing the shadow cells 100 of the shadow register. The shadow port is a fifth port which is used for transparent initialization and readback of the contents of the entire memory block 10. By using the shadow register, a synchronous snapshot of the contents of all memory storage cells 91 within a memory block 10 may be taken at an arbitrary instant in time so that an internally consistent view of the memory contents may be obtained. The snapshot of the memory contents is accurate and does not suffer from timing problems. The shadow register may also be used to load the memory array synchronously to an initial, predetermined state. Once loaded, the FPGA may start executing from that state forward. Thus, the shadow register is particularly useful for debugging and diagnostics.

In operation, the content of each memory storage cell 91 can be downloaded into the corresponding shadow cell 100. Each shadow cell 100 is preferably comprised of two inverters, as for each memory storage cell 91. By placing a high level on the Load Shadow enable line 102 which runs to each memory block 10, each shadow cell 100 is loaded with the data from each memory storage cell 91. From there, the data may be read out on the Shadow Data line 112 and Shadow Data Bar line 110 by placing a high level on the Read/Write Shadow line 108. The Shadow Data Bar line is also known as the Shadow Data-line. The transfer circuit 104 causes data to be transferred between the memory storage cell 91 and the shadow cell 100. Since this loading of the shadow register occurs synchronously, a true snapshot of the memory array can be taken accurately. Data is transferred from the shadow register to the shadow data lines 110, 112.

Each memory storage cell 91 can also be loaded synchronously (with respect to other memory cells) from the shadow register by placing a high level on the Restore Shadow enable line 106 which runs to each memory block 10. Data must have been previously loaded into the shadow register by placing a high level on the Read/Write Shadow line 108 while providing data on the Shadow Data 112 and Shadow Data Bar 110 lines.

Figure 6:
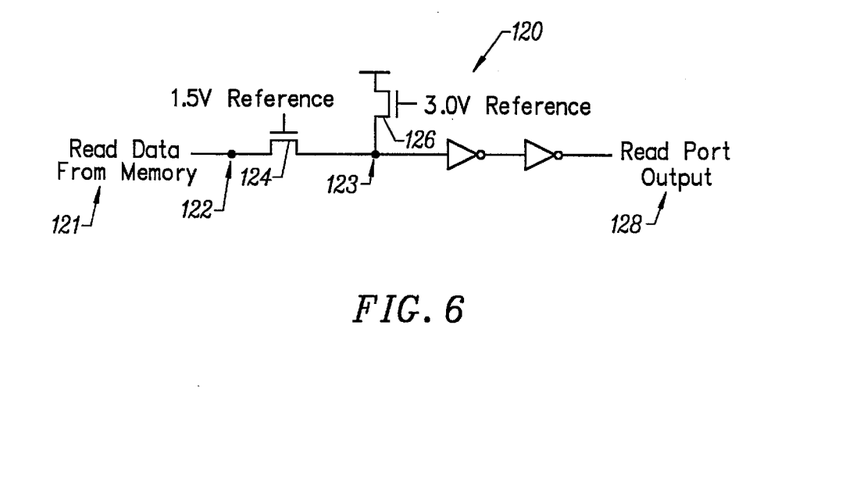
FIG. 6 is a circuit diagram of a read sense amplifier used to read the data off a data line.

A simple sense amplifier is adequate for reading data off the data line of a read port. FIG. 6 is a circuit schematic of a cascode read sense amplifier 120 used in the preferred embodiment. The read sense amplifier 120 is of a type well-known to designers of static memories. The read sense amplifier 120 receives data from memory on an input line 121. Transistor 124 helps optimize speed of the read sense amplifier by alleviating the effect of large capacitance on the line 121. High capacitance exists on input line 121 because input line 121 is connected to a large number of memory cells. By isolating the capacitance of the input line 121 from the capacitance of the node 123, transistor 124 permits node 123 to switch faster. PMOS transistor 126 has a gate connected to a 3.0 volt reference, a source connected to 5 volts and a drain connected to node 123 of the data line. Transistor 126 provides a current which tends to pull up node 123 to VCC unless the selected memory cell is pulling down on node 122. Since transistor 126 provides only a limited pull up current, any cell which pulls down on node 122 will also pull down node 123 to a low logic level. Transistors connected to the read data lines as shown on FIG. 4 pull the data line down to a low voltage when the memory is read. Other well-known read sense amplifiers may be used alternatively.

Total of fifteen possible combinations of width/depth options and addresses exist which determine which RAM bits to write. The following table shows how these combinations, represented by fifteen select signals, are derived:

| Width | ADR[2:0] | Select Signal |
|---|---|---|
| 8 | XXX | S8 |
| 4 | 0XX | S40 |

| Width | ADR[2:0] | Select Signal |
|---|---|---|
| 4 | 1XX | S44 |
| 2 | 00X | S20 |
| 2 | 01X | S22 |
| 2 | 10X | S24 |
| 2 | 11X | S26 |
| 1 | 000 | S10 |
| 1 | 001 | S11 |
| 1 | 010 | S12 |
| 1 | 011 | S13 |
| 1 | 100 | S14 |
| 1 | 101 | S15 |
| 1 | 110 | S16 |
| 1 | 111 | S17 |

The width column represents the number of bits per port; the ADR[2:0] signifies how the address bits are used to select which select signal is active; the select signals control which memory cell is used for writing a data bit. For example, if the width option is eight, only select signal S8 is active because all memory bits in a byte will be written to memory (one bit to each cell). For the width=4 option, S40 and S44 will be the only possible active select signals because either the upper four bits or the lower four bits will be written depending on whether the ADR2 address bit is a one or zero. If the ADR2 address bit is a zero, S40 will be active and S44 will be inactive. The select signals are used to control the memory's data lines and, therefore, the memory location to which a data bit will be written.

Figure 7:
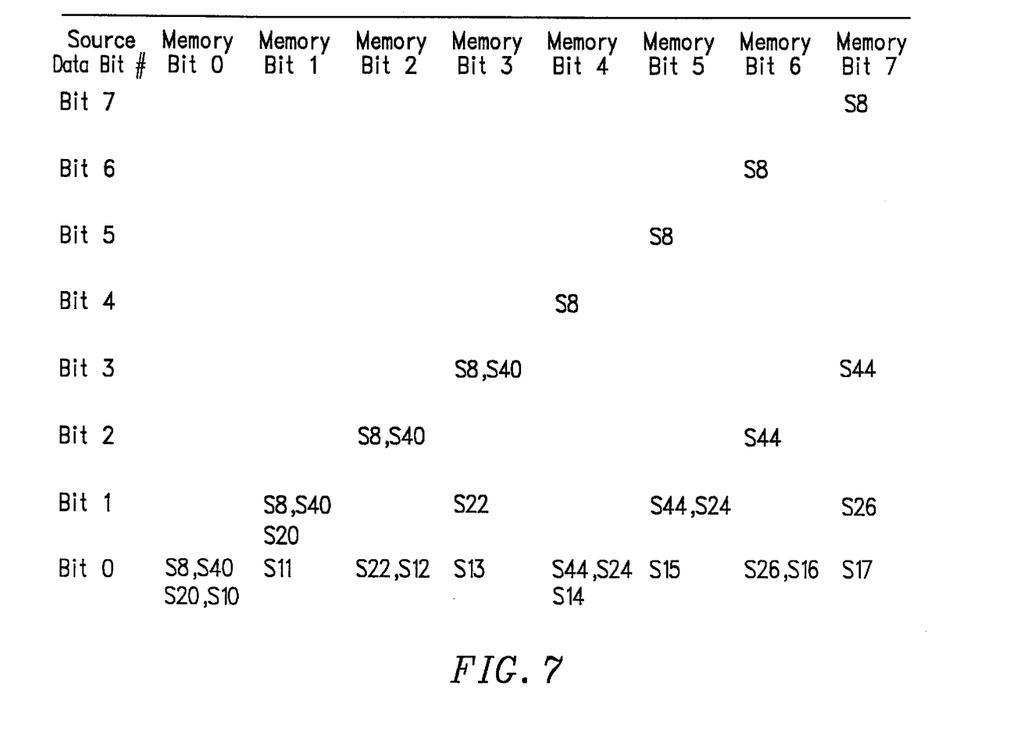
FIG. 7 is a table that shows where each bit of a data word is written into memory, depending on the selected configuration of the width and depth of the memory.

FIG. 7 is a table that shows to which memory bit location each input data bit will be written, depending on which select signals are active. The "Source Data Bit #" column signifies the eight bits of a data word which is to be stored into memory. Each Memory Bit column is connected to all memory cells in a column of the memory array. The actual physical implementation of the memory is eight bits wide, even though the memory may be configured into a variety of width/depth options. Select signal S8 is active for an 8 by 128 memory; S40 or S44 for a 4 by 256 memory; S20, S22, S24 or S26 for a 2 by 512 memory; and S10, S11, S12, S13, S14, S15, S16 or S17 for a 1 by 1024 memory.

Figure 8:
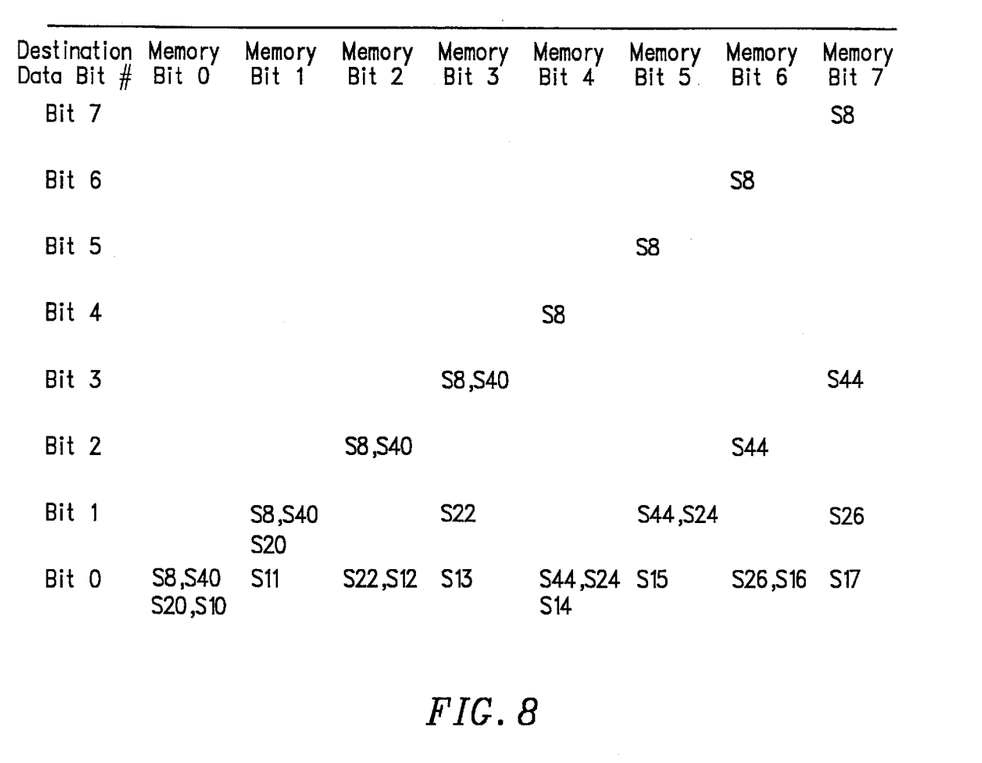
FIG. 8 is a table that shows where each bit in memory is read out, depending on the selected configuration of the width and depth of the memory.

For example, if the width=8 option was selected, select signal S8 would be active and the rest of the select signals would be inactive. The data word being written into memory comprises source bits 0–7 where source bit 7 is the most significant bit. In a width=8 memory, source bit 0 would be sent to the column 0 of the memory (and then to a memory cell as selected by the address), source bit 1 to column 1 and so on, with source bit 7 going to column 7. FIG. 8 is a similar table which shows how data being read out of the memory is rearranged. If data is to be read out of a memory which has been configured as a width=8 memory, select signal S8 would be active, causing bits 0–7 to come from columns 0–7 of the memory and arrive as destination data bits 0–7 respectively.

Turning back to FIG. 7, if a width=4 memory was selected, a data word to be written into memory would comprise source bits 0–3. If the low order bit of the address was a zero, select signal S40 would be active and source bit 0 would go to column 0 of the memory, source bit 1 to column 1, source bit 2 to column 2 and source bit 3 to column 3. If the low order bit of the address was a one, select signal S44 would be active so that source bit 0 would go to column 4 of the memory, source bit 1 to column 5, source bit 2 to column 6 and source bit 3 to column 7. Thus, the physically eight-bit wide memory can be configured as two four-bit wide memories. The same principles of operation apply to a width=2 and width=1 memory. A programmable logic array (PLA) may be used to move data into and out of the memory based on the select signals.

Figure 9:
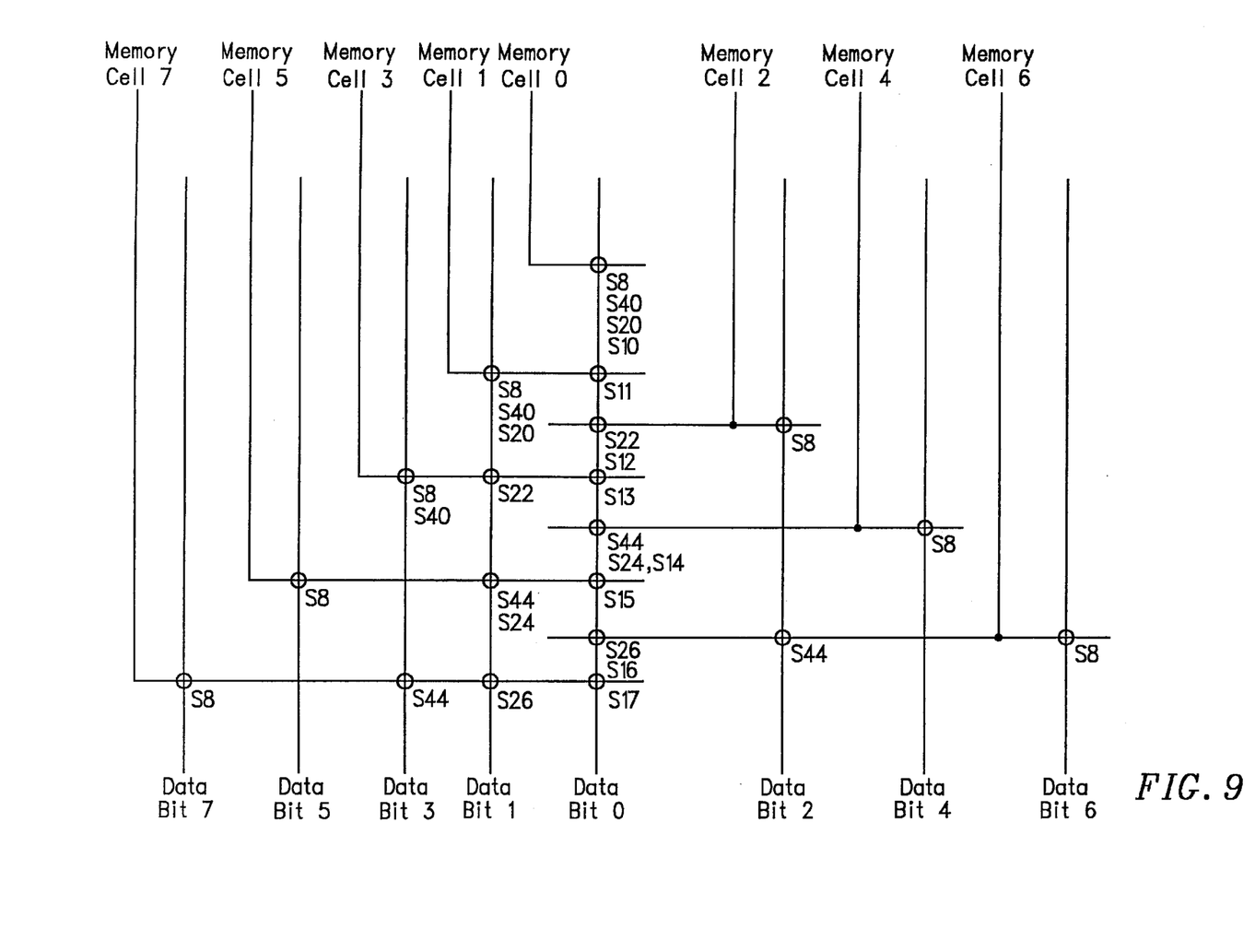
FIG. 9 is a crosspoint array which implements the table of FIG. 8.

FIG. 9 is a crosspoint array that may be used to implement the table of FIG. 8. Each crosspoint may comprise a field effect transistor that turns on when any one of the select signals going to the transistor is active. When the transistor conducts, a connection is made between a column of memory cells and the destination data bit. For example, when select signal S40 is active, destination data bits 3, 1, 0 and 2 are connected to columns 3, 1, 0 and 2 of the memory. The crosspoints may also be implemented with other circuits that are well-known in the art.

Figure 10:
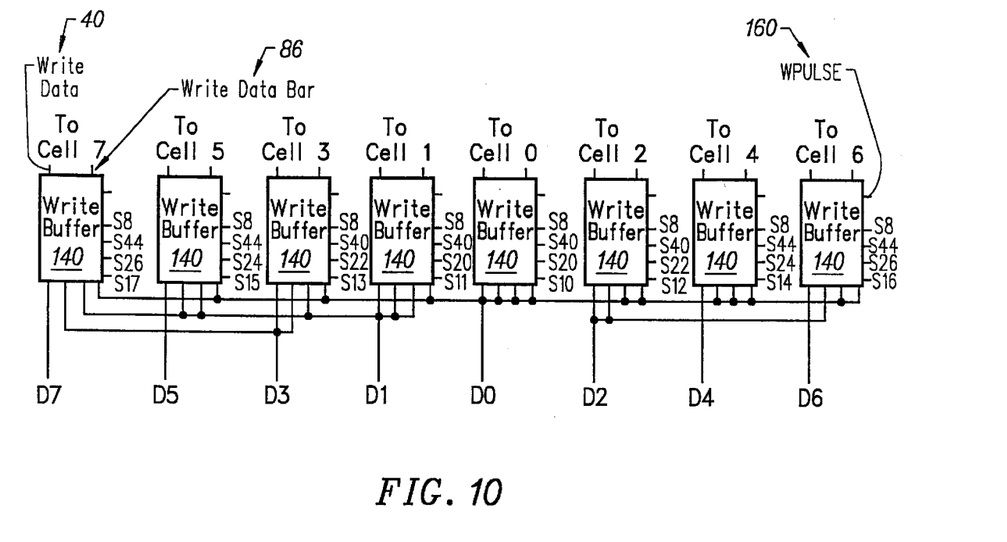
FIG. 10 is a circuit diagram that uses multiple write buffer circuits to generate the Write Data and Write Data Bar control signals.

FIG. 10 is a circuit schematic of write buffer circuits used to route source data bits to the correct memory bit locations, depending on the selected width/depth configuration as specified in the table of FIG. 7. Eight write buffer circuits 140 are arranged as shown in FIG. 10. Each write buffer circuit receives four of the possible select signals as well as four of the eight possible source data bits D0–D7. The select signals are derived from the width/depth configuration option selected and the lowest three bits of the address as shown previously. The D0–D7 signals are source data signals originating from the user for writing to memory. For example, the leftmost write buffer circuit 140 receives select signals S8, S44, S26 and S17 as well as source data bits D0, D1, D3 and D7. Depending on which select signal is active, a write buffer circuit 140 will route one of its source data bits to the Write Data line 40 and its complement to the Write Data Bar line 86. As a further example, if select signal S26 is active for the leftmost write buffer circuit 140, the write buffer circuit 140 will transfer source data bit D1 to column 7 of the memory (per FIG. 7). Instead, if select signal S44 were active for the leftmost write buffer circuit 140, source data bit D3 will be sent to column 7 of the memory. Hence, the inputs to each write buffer circuit 140 of FIG. 10 matches the entries in the table of FIG. 7.

The write buffer circuits 140 are arranged in the order shown in FIG. 10 because this arrangement of write buffer circuits minimizes the required interconnect and performs the desired data movement as shown in the table of FIG. 7.

Figure 11:
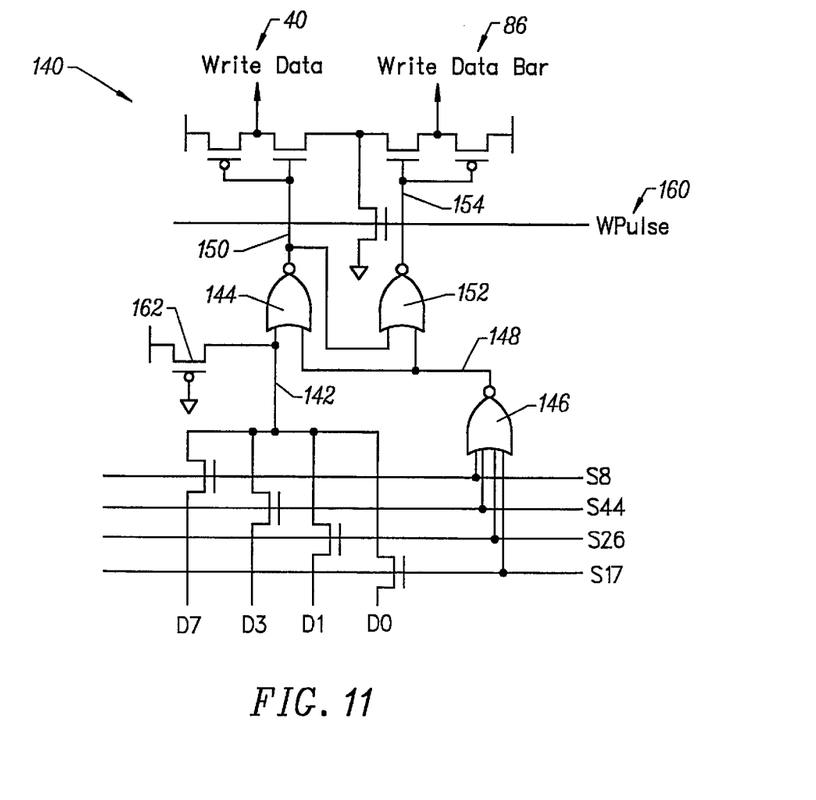
FIG. 11 is a detailed circuit schematic of the write buffer circuit shown in FIG. 10.

FIG. 11 is a detailed circuit schematic of one of the write buffer circuits 140 used in FIG. 10. Each write buffer circuit 140 generates the Write Data and Write Data Bar signals of FIG. 4. The write buffer circuit 140 receives four of the select signals and four of the eight source data bits. The particular write buffer circuit 140 selected for illustration in FIG. 11 is the leftmost write buffer circuit 140 of FIG. 10.

One of the source data bits (D0, D1, D3, D7) is selected by the active select signal (S8, S44, S26 or S17) to pass to line 142 to NOR gate 144. The other input to the NOR gate 144 comes from the output 148 of NOR gate 146. NOR gate 144 sends the selected data bit onto line 150 and onto the Write Data line 40. The output 154 of the NOR gate 152 is used to generate the complementary data bit on Write Data Bar line 86. WPulse signal 160 serves as a master timing signal that controls writing to the memory cells. The generation of WPulse signal 160 is shown in FIG. 2. The WPulse signal 160 causes either the Write Data signal 40 or the Write Data Bar signal 86 to go low assuming one of the select signals is high, thereby causing the data bit selected from the D0–D7 signals to be written into the bit of memory attached to the Write Data and Write Data Bar signals 40, 86 and selected by the remaining address inputs ADR [3:9].

Transistor 162 pulls line 142 up to a logic 1 when all the transistors connected to D0, D1, D3 and D7 are off. The memory blocks 10 may be written to either synchronously via the shadow register or asynchronously via the WPulse 160 signal.

While the invention is susceptible to various modifications and alternative forms, specific examples thereof have been shown by way of example in the drawings and are herein described in detail. It should be understood, however, that it is not intended to limit the invention to the particular forms disclosed, but on the contrary, the invention is to cover all modifications, equivalents, and alternatives falling within the spirit and scope of the invention as defined by the following claims.

What is claimed is:

1. A field programmable gate array integrated circuit comprising:
   a logic element programmably configurable to implement user-defined combinatorial or registered logic functions; and
   a memory block to store data, coupled to the logic element, wherein the memory block comprises:
      a write buffer circuit comprising:
         a plurality of data inputs, selectively coupled to a first logic gate by using a plurality of select inputs;
         a second logic gate, receiving the select inputs and providing a second logic gate output to the first logic gate; and
         a third logic gate, receiving the second logic gate output.

2. The integrated circuit of claim 1 wherein the write buffer circuit further comprises:
   a first and second transistor coupled in series between a first supply and a first node, wherein gates of the first and second transistor are coupled to first logic gate output; and
   a third and fourth transistor coupled in series between the first supply and the first node, wherein gates of the third and fourth transistor are coupled to a third logic gate output.

3. The integrated circuit of claim 2 wherein the write buffer circuit further comprises:
   a fifth transistor coupled between the first node and a second supply, wherein the first node is selectively coupled to the second supply based on a write pulse input.

4. The integrated circuit of claim 3 further comprising:
   a write pulse generator circuit comprising:
      a fourth logic gate, receiving a user write enable signal and a delayed inverted version of the user write enable signal and generating the write pulse signal, wherein a pulse width of the write pulse signal is about a delay between leading edges of the user write enable signal and the delayed inverted version of the user write enable signal.

5. The integrated circuit of claim 4 wherein the write pulse generator circuit further comprises:
   a fifth logic gate, receiving the write pulse signal and a delayed version of the write pulse signal, and generating a write busy signal.

6. The integrated circuit of claim 5 wherein the fifth logic gate provides an OR logical function.

7. The integrated circuit of claim 4 wherein the fourth logic gate provides an AND logical function.

8. The integrated circuit of claim 1 wherein the logic element comprises:

a multiple-input look-up table;

a delay element coupled to an output of the look-up table;

a multiplexer comprising a first input coupled to an output of the delay element, a second input coupled to an output of the look-up table, and a third input coupled to an output of the memory block; and a register coupled to receive an output of the multiplexer.

9. The integrated circuit of claim 1 wherein the memory block further comprises:

a plurality of memory cells;

a register;

a port for loading data into the register; and a load circuit for loading data from the register to the plurality of memory cells.

10. The integrated circuit of claim 9 wherein the memory cells are initialized using the data loaded from the register.

11. The integrated circuit of claim 1 wherein the memory block further comprises:

a plurality of memory cells;

a plurality of ports to write data to the memory cells and read data from the memory cells;

a register coupled to the memory cells to store data in the memory cells; and a port to read data from the register.

12. The integrated circuit of claim 11 wherein the register further comprises a load circuit to load data from the memory cells to the register.

13. The integrated circuit of claim 11 wherein each bit in the register corresponds to data stored in one of the memory cells.

14. The integrated circuit of claim 11 wherein each memory cell can be stored in a bit of the register.

15. The integrated circuit of claim 1 wherein the logic element comprises a look-up table.

16. The integrated circuit of claim 15 wherein the logic element comprises a register coupled to the look-up table.

17. The integrated circuit of claim 16 wherein the logic element comprises a multiplexer coupled to an output of the look-up table and an output of the register.

18. The integrated circuit of claim 15 wherein an output of the look-up table is coupled to the memory block.

19. The integrated circuit of claim 15 wherein the logic element comprises:

a look-up table;

a first multiplexer coupled to an output of the look-up table and the memory block;

a register coupled to an output of the first multiplexer; and a second multiplexer coupled to outputs of the first multiplexer and the register.

20. The integrated circuit of claim 19 wherein the look-up table provides a logical function of four variables.

21. The integrated circuit of claim 1 wherein the first logic gate is a NOR gate.

22. The integrated circuit of claim 1 wherein the first and second logic gates are NOR gates.

23. The integrated circuit of claim 1 wherein the memory block is a multiport memory, providing a read port and a write port to permit read and write access of the memory during the same access cycle.

24. The integrated circuit of claim 1 wherein the memory block has a width size and depth size that are programmably configurable.

25. The integrated circuit of claim 1 wherein the memory block is a multiport memory, and a width and depth for a first port of the memory block is configurable independently of a width and a depth of a second port of the memory block.

26. The integrated circuit of claim 1 wherein the memory block is configurable as a 1K by 1,512 by 2,256 by 4, or 128 by 8 memory.

27. The integrated circuit of claim 1 wherein the memory block has a write port and a read port to permit reading of data from the memory using the read port while data is being written into the memory using the write port.

28. The integrated circuit of claim 1 wherein the memory block comprises a memory cell comprising:

a storage cell coupled to provide a first read data signal via a port and a second read data signal via a second port.

29. The integrated circuit of claim 28 wherein the memory cell further comprises:

a shadow cell coupled to provide a third data read signal via a third port and a fourth data read signal via a fourth port.

30. The integrated circuit of claim 29 wherein the shadow cell is a static memory cell.

31. The integrated circuit of claim 28 wherein the storage cell is coupled to receive a third data write signal via a third part and a second data write signal via a fourth port.

32. The integrated circuit of claim 31 wherein the storage cell is further coupled to receive a third data write signal via a fifth port and a fourth data write signal via a sixth port.

33. The integrated circuit of claim 28 wherein the storage cell is a static memory cell.

34. The integrated circuit of claim 1 wherein the logic element comprises a multiplexer having an input coupled to the memory block.

35. The integrated circuit of claim 34 wherein the memory block has a read port and a write port.

36. The integrated circuit of claim 34 wherein the multiplexer has an output coupled to a storage block of the logic element.

37. The integrated circuit of claim 36 wherein the storage block is configurable to operate as a latch or a flip-flop.

38. The integrated circuit of claim 36 wherein the logic element further comprises a look-up table coupled to another input of the multiplexer.

39. The integrated circuit of claim 1 wherein the memory block comprises a read port coupled to a read amplifier circuit comprising:

a first transistor, coupled between the read port and a first node, having a gate coupled to a first reference voltage; and a second transistor, coupled between the first node and a supply voltage, having a gate coupled to a second reference voltage.

40. The integrated circuit of claim 39 wherein the first reference voltage is about 1.5 volts.

41. The integrated circuit of claim 39 wherein the second reference voltage is about 3 volts.

42. The integrated circuit of claim 39 wherein the first reference voltage is below the second reference voltage, and the second reference voltage is below the supply voltage.

43. The integrated circuit of claim 1 wherein the write buffer circuit further comprises:

a first transistor coupled between a first node and a second node, having a gate coupled to a first logic gate output;

a second transistor coupled between the second node and a first supply, having a gate coupled to the first logic gate output;

a third transistor coupled between the fist node and a third node, having a gate coupled to a third logic gate output; and a fourth transistor coupled between the third node and the first supply, having a gate coupled to the third logic gate output, wherein the second and fourth transistors are PMOS devices, and the first and third transistor are NMOS devices.

44. The integrated circuit of claim 43 wherein the first node is coupled to ground.

45. The integrated circuit of claim 43 wherein the first node is coupled to ground during a write operation.

46. The integrated circuit of claim 43 wherein the first logic gate is a NOR gate, and the third logic gate is a NOR gate.

47. The integrated circuit of claim 46 wherein the plurality of data inputs comprises at least four data inputs, and the plurality of select inputs comprises at least four select inputs.

48. The integrated circuit of claim 1 wherein the logic element comprises:

a look-up table providing a look-up table output; and a register coupled to the look-up table output and providing a register output.

49. The integrated circuit of claim 48 wherein the first logic gate is a NOR gate, and the third logic gate is a NOR gate.

50. The integrated circuit of claim 49 wherein the plurality of data inputs comprises at least four data inputs, and the plurality of select inputs comprises at least four select inputs.

51. The integrated circuit of claim 1 wherein the first logic gate is a NOR gate, and the third logic gate is a NOR gate.

52. The integrated circuit of claim 1 wherein the logic element comprises a look-up table circuit and the third logic gate receives an output of the first logic gate.

53. A field programmable gate array integrated circuit comprising:

a memory including at least one memory block;

said memory block having memory cells, said memory block having a configurable width and a configurable depth such that increasing the width results in decreasing the depth and decreasing the width results in increasing the depth;

wherein said memory block further comprises a read port that reads data out of said memory block and a write port that writes data into said memory block where the width and depth of said read port are independently configurable of the width and depth of said write port.

54. The integrated circuit of claim 53 wherein said memory block comprises a plurality of read ports that read data out of said memory block where the width and depth of one of said read ports is independently configurable of the width and depth of the remaining of said read ports.

55. The integrated circuit of claim 53 wherein said memory block further comprises a plurality of write ports that write data into said memory block wherein the width and depth of one of said write ports is independently configurable of the width and depth of the remaining of said write ports.

56. The integrated circuit of claim 53 wherein said integrated circuit further comprises:

a plurality of logic blocks which transmit and receive signals;

an interconnect network to route the signals between said logic blocks, where said memory is associated with said logic blocks and stores certain of the signals.

57. The integrated circuit of claim 56, said memory block further comprising a plurality of read ports that read data out of said memory block wherein the width and depth of one of said read ports is independently configurable of the width and depth of the remaining of said read ports.

58. The integrated circuit of claim 56, said memory block further comprising a plurality of write ports that write data into said memory block wherein the width and depth of one of said write ports is independently configurable of the width and depth of the remaining of said write ports.

59. The integrated circuit of claim 53 further comprising:

said memory receiving data signals;

said memory cells within said memory block being configured in rows and columns; and write buffer circuitry selectively routing each data signal received by said memory to a said memory cell of a column of said memory block.

60. The integrated circuit of claim 53 further comprising:

said memory storing data signals;

said memory cells within said memory block being configured in rows and columns; and read buffer circuitry selectively routing each data signal from a said memory cell of a column of said memory block out of said memory block.

61. The integrated circuit of claim 53 further comprising:

said memory storing data signals;

said memory cells within said memory block being configured in rows and columns;

write buffer circuitry selectively routing each data signal received by said memory to a said memory cell of a column of said memory block; and read buffer circuitry selectively routing each data signal from a said memory cell of a column of said memory block out of said memory block.

62. The integrated circuit of claim 53 wherein said memory block is configurable to act as one eight-bit wide memory, two four-bit wide memories, four two-bit wide memories, or eight one-bit wide memories.

63. A field programmable gate array integrated circuit comprising:

a memory including at least one memory block;

said memory block having memory cells, wherein said memory block has a configurable width and a configurable depth such that increasing the width results in decreasing the depth and decreasing the width results in increasing the depth, and wherein said memory block further comprises a plurality of read ports that read data out of said memory block where the width and depth of one of said read ports are independently configurable of the width and depth of the remaining said read ports.

64. The integrated circuit of claim 63 where said integrated circuit further comprises:

a plurality of logic blocks which it and receive signals; and an interconnect network to route the signals between said logic blocks, where said memory is associated with said logic blocks and stores certain of the signals.

65. The integrated circuit of claim 64, said memory block further comprising a plurality of write ports that write data into said memory block wherein the width and depth of one of said write ports is independently configurable of the width and depth of the remaining of said write ports.

66. The integrated circuit of claim 63 further comprising:

said memory receiving data signals;

said memory cells within said memory block being configured in rows and columns; and write buffer circuitry selectively routing each data signal received by said memory to a said memory cell of a column of said memory block.

67. The integrated circuit of claim 63 further comprising:
said memory storing data signals;
said memory cells within said memory block being configured in rows and columns; and
read buffer circuitry selectively routing each data signal from a said memory cell of a column of said memory block out of said memory block.

68. The integrated circuit of claim 63 further comprising:
said memory storing data signals;
said memory cells within said memory block being configured in rows and columns;
write buffer circuitry selectively routing each data signal received by said memory to a said memory cell of a column of said memory block; and
read buffer circuitry selectively routing each data signal from a said memory cell of a column of said memory block out of said memory block.

69. The integrated circuit of claim 63 wherein said memory block is configurable to act as one eight-bit wide memory, two four-bit wide memories, four two-bit wide memories, or eight one-bit wide memories.

70. A field programmable gate array integrated circuit comprising:
a memory including at least one memory block;
said memory block having memory cells, wherein said memory block has a configurable width and a configurable depth such that increasing the width results in decreasing the depth and decreasing the width results in increasing the depth, and
wherein said memory block further comprises a plurality of write ports that write data into said memory block where the width and depth of one of said write ports are independently configurable of the width and depth of said write port.

71. The integrated circuit of claim 70 wherein said integrated circuit further comprises:
a plurality of logic blocks which transmit and receive signals; and
an interconnect network to route the signals been said logic blocks,
where said memory is associated hit said logic blocks and stores certain of the signals.

72. The integrated circuit of claim 71, said memory block further comprising a plurality of read ports that read data out of said memory block where in the width and depth of one of said read ports is independently configurable of the width and depth of the remaining of said read ports.

73. The integrated circuit of claim 70 further comprising:
said memory receiving data signals;
said memory cells within said memory block being configured in rows and columns; and
write buffer circuitry selectively routing each data signal received by said memory to a said memory cell of a column of said memory block.

74. The integrated circuit of claim 70 further comprising:
said memory storing data signals;
said memory cells within said memory block being configured in rows and columns; and
read buffer circuitry selectively routing each data signal from a said memory cell of a column of said memory block out of said memory block.

75. The integrated circuit of claim 70 further comprising:
said memory storing data signals;
said memory cells within said memory block being configured in rows and columns;
write buffer circuitry selectively routing each data signal received by said memory to a said memory cell of a column of said memory block; and
read buffer circuitry selectively routing each data signal from a said memory cell of a column of said memory block out of said memory block.

76. The integrated circuit of claim 70 wherein said memory block is configurable to act as one eight-bit wide memory, two four-bit wide memories, four two-bit wide memories, or eight one-bit wide memories.

77. A field programmable gate array integrated circuit comprising:
a first logic element programmably configurable to implement user-defined logic functions; and
a first configurable memory block coupled to the first logic element, capable of being written to and read from, wherein the first configurable memory block has a configurable width and a configurable depth such that increasing the width results in decreasing the depth, and decreasing the width results in increasing the depth;
wherein the first configurable memory block comprises:
a write buffer comprising:
a plurality of data inputs;
a plurality of select lines for selecting one of the plurality of data inputs;
a first logic gate having an first input and a second input, the first input coupled to the selected one of the plurality of data inputs;
a second logic gate, coupled to the select lines, and having an output coupled to the second input of the first logic gate; and
a third logic gate having a first input and a second input, the first input coupled to the output of the second logic gate.

78. The integrated circuit of claim 77 further comprising:
a second logic element programmably configurable to implement user-defined logic functions; and
a second configurable memory block coupled to the second logic element, capable of being written to and read from, wherein the second configurable memory block has a configurable width and a configurable depth such that increasing the width results in decreasing the depth, and decreasing the width results in increasing the depth, and
wherein the width and depth of the first configurable memory block may be configured differently than the width and depth of the second configurable memory block.

79. The integrated circuit of claim 78 wherein the selecting one of the plurality of data inputs is done using a multiplexer.

80. The integrated circuit of claim 79 wherein the multiplexer comprises a plurality of pass devices.

81. The integrated circuit of claim 80 wherein the multiplexer further comprises an output coupled to a pull-up, the pull-up coupled to a first positive voltage supply.

82. The integrated circuit of claim 81 wherein the first configurable memory block and the second configurable memory block each comprise a first number of memory cells for storing data, and wherein the first number of memory cells is greater than 1000.

83. The integrated circuit of claim 82 wherein each pass device comprises a control electrode, a first source/drain area and a second source/drain area, and wherein the control electrode is coupled to one of the plurality of select lines, the first source/drain area is coupled to one of the plurality of data lines, and the second source drain area is coupled to the first logic gate.

84. The integrated circuit of claim 83 wherein the memory is synchronous.

85. The integrated circuit of claim 84 wherein each memory cell comprises a first inverter and a second inverter, an output of the first inverter coupled to an output of the second inverter, and an output of the second inverter coupled to an input of the first inverter.

86. The integrated circuit of claim 85 wherein each memory cell couples to a read port output through a pass device.

87. The integrated circuit of claim 85 wherein each memory cell couples to a read port output through at least one pass device and at least one inverter.

88. The integrated circuit of claim 87 where the first logic gate couples to a memory cell through at least one inverter and one pass gate, and the third logic gate couples to the memory cell through at least one inverter and one pass gate.

89. The integrated circuit of claim 88 wherein the first logic gate and the third logic gate are NOR gates.

90. The integrated circuit of claim 89 wherein the plurality of data inputs comprises four data inputs, and the plurality of select lines comprises four select lines.

91. The integrated circuit of claim 77 wherein the second input of the third logic gate couples to an output of the first logic gate.

92. A field programmable gate array integrated circuit comprising:

a logic element, programmably configurable to implement user-defined combinatorial or registered logic functions, comprising a look-up table; and a memory block to store data, coupled to the logic element, wherein the memory block comprises:

a write buffer circuit, coupled to memory cells of the memory block, comprising:

at least three data inputs, selectively coupled to a first NOR gate by using at least three select inputs;

a first logic gate, receiving the select inputs and providing a first logic gate output to the first NOR gate; and a second NOR gate, receiving the first logic gate output.

93. The integrated circuit of claim 92 wherein the write buffer circuit further comprises:

a first and second transistor coupled in series between a first node and a second node, wherein gates of the first and second transistor are coupled to a first NOR gate output; and a third and fourth transistor coupled in series between the first node and the second node, wherein gates of the third and fourth transistor are coupled to a second NOR gate output.

94. The integrated circuit of claim 93 wherein the first node is VCC.

95. The integrated circuit of claim 94 wherein the second node is coupled to ground when the write data buffer circuit writes to the memory cells.

96. The integrated circuit of claim 93 wherein a third node, between the first and second transistors, drives a write data line of a memory cell, and a fourth node, between the third and fourth transistors, drives a write data bar line of the memory cell, wherein a signal on the write data bar line is a complement of a signal on the write data line.

97. The integrated circuit of claim 96 wherein each memory cell comprises a first inverter and a second inverter, wherein an output of the first inverter is coupled to an input of the second inverter and an output of the second inverter is coupled to an input of the first inverter, and the memory block further comprises:

a fifth transistor coupled between the write data line and the input of the first inverter; and a sixth transistor coupled between the write data bar line and the input of the second inverter.

98. The integrated circuit of claim 97 wherein the memory block further comprises:

a read data line receiving data stored in the memory cell;

a third inverter; and a seventh transistor coupled between the read data line and an input of the third inverter.

99. The integrated circuit of claim 92 wherein the write buffer circuit further comprises:

a PMOS transistor coupled between an input of the first NOR gate and a supply voltage.

100. The integrated circuit of claim 99 wherein a gate of the PMOS transistor is coupled to ground.

101. The integrated circuit of claim 92 wherein the write data buffer further comprises:

a first NMOS transistor coupled between a first data input of the three data inputs and a first input of the first NOR gate;

a second NMOS transistor coupled between a second data input of the three data inputs and the first input of the first NOR gate; and a third NMOS transistor coupled between a third data input of the three data inputs and the first input of the first NOR gate, wherein a first select input of the three select inputs is coupled to a gate of the first NMOS transistor, a second select input of the three select inputs is coupled to a gate of the second NMOS transistor, and a third select input of the three select inputs is coupled to a gate of the third NMOS transistor.

102. The integrated circuit of claim 101 wherein the memory block comprises at least 1000 memory cells and the write buffer circuit is coupled to a portion of the at least 1000 memory cells.

103. The integrated circuit of claim 107 wherein the write buffer circuit further comprises:

a fourth NMOS transistor and coupled PMOS transistor coupled in series between a first node and a second node, wherein gates of the fourth NMOS and first PMOS transistors arm coupled to a first NOR gate output; and a fifth NMOS transistor and second PMOS transistor coupled in series between the first node and the second node,wherein pates of the fifth NMOS and second PMOS transistors are coupled to a second NOR gate output.

104. The integrated circuit of claim 103 wherein a third node, between the fourth NMOS and first PMOS transistors, drives a write data line of a memory cell, and a fourth node, between the fifth NMOS and second PMOS transistors, drives a write data bar line of the memory cell, wherein a signal on the write data bar line is a complement of a signal on the write data line.

105. The integrated circuit of claim 104 wherein the write buffer circuit further comprises:
   a third PMOS transistor coupled between the first input of the first NOR gate and a VCC supply voltage.

106. The integrated circuit of claim 103 wherein the write buffer circuit further comprises:
   a third PMOS transistor coupled between the first input of the first NOR gate and a VCC supply voltage.

107. The integrated circuit of claim 106 wherein the memory block has a configurable width and a configurable depth such that increasing the width results in decreasing the depth and decreasing the width results in increasing the depth, and
   wherein the memory block further comprises a plurality of read ports that read data out of the memory block where the width and depth of one of the read ports are independently configurable of the width and depth of the remaining read ports.

108. The integrated circuit of claim 101 wherein the write buffer circuit further comprises:
   a PMOS transistor coupled between the first input of the first NOR gate and a VCC supply voltage.

109. The integrated circuit of claim 108 wherein the memory block has a configurable width and a configurable depth such that increasing the width results in decreasing the depth and decreasing the width results in increasing the depth, and
   wherein the memory block further comprises a plurality of read ports that read data out of the memory block where the width and depth of one of the read ports are independently configurable of the width and depth of the remaining read ports.

110. The integrated circuit of claim 92 wherein the memory block has a configurable width and a configurable depth such that increasing the width results in decreasing the depth and decreasing the width results in increasing the depth, and wherein the memory block further comprises a plurality of read ports that read data out of the memory block where the width and depth of one of the read ports are independently configurable of the width and depth of the remaining read ports.

111. The integrated circuit of claim 92 wherein the first logic gate is a NOR gate.

112. The integrated circuit of claim 92 wherein there are at least four data inputs and four select inputs.

113. The integrated circuit of claim 92 wherein the second NOR gate further receives an output of the first NOR gate.

114. The integrated circuit of claim 92 wherein the memory block further comprises a plurality of read ports to read data from the memory block and a plurality of write ports to write data to the memory block.

115. The transistor of claim 114 wherein the plurality of read ports has two read ports and the plurality of write ports has two write ports.

116. A field programmable gate array integrated circuit comprising:
   a logic element, programmably configurable to implement user-defined combinatorial or registered logic functions, comprising a look-up table; and
   a memory block to store data, coupled to the logic element, wherein the memory block comprises:
      a plurality of write ports to write data to the memory block; and
      a write buffer circuit comprising:
         a plurality of data inputs, selectively coupled to a first logic gate by using a plurality of select inputs;
         a second logic gate, receiving the select inputs and providing a second logic gate output to the first logic gate; and
         a third logic gate, receiving the second logic gate output.

117. The integrated circuit of claim 116 wherein the memory block further comprises a plurality of read ports to data from the memory block.

118. The integrated circuit of claim 117 wherein the write buffer circuit further comprises;
   a first and second transistor coupled in series between a first supply and a first node, wherein gates of the first and second transistor are coupled to a first logic gate output; and
   a third and fourth transistor coupled in series between the first supply and the first node, wherein gates of the third and fourth transistor are coupled to a third logic gate output.

119. The integrated of claim 118 wherein the write buffer circuit further comprises:
   a fifth transistor coupled between the first node and a second supply, wherein the first node is selectively coupled to the second supply based on a write pulse input.

120. The integrated circuit of claim 119 further comprising:
   a write pulse generator circuit comprising:
      a fourth logic gate, receiving a user write enable signal and a delayed inverted version of the user write enable signal and generating the write pulse signal, wherein a pulse width of the write pulse signal is about a delay between leading edges of the user write enable signal and the delayed inverted version of the user write enable signal.

121. The integrated circuit of claim 116 wherein each write port is coupled to a write buffer circuit.

122. The integrated circuit of claim 116 wherein a first write port is coupled to a first write buffer circuit and a second write port is coupled to a second write buffer circuit.

123. A field programmable gate array integrated circuit comprising:
   a logic element programmably configurable to implement user-defined logic functions; and
   a memory block coupled to the first logic element, capable of being written to and read from, wherein the memory block comprises:
      a write buffer comprising:
         a plurality of data inputs;
         a plurality of select lines for selecting one of the plurality of data inputs;
         a first logic gate having an first input and a second input, the first input coupled to the selected one of the plurality of data inputs;
         a second logic gate, coupled to the select lines, and having an output coupled to the second input of the first logic gate; and
         a third logic gate having a first input and a second input, the first input coupled to the output of the second logic gate.

124. The integrated circuit of claim 123 wherein the selecting one of the plurality of data inputs is done using a multiplexer.

125. The integrated circuit of claim 124 wherein the multiplexer comprises a plurality of pass devices.

126. The integrated circuit of claim 125 wherein the multiplexer further comprises an output coupled to a pull-up, the pull-up coupled to a first positive voltage supply.

127. The integrated circuit of claim 123 wherein the memory block further comprises a plurality of write ports to write data to the memory block.

128. The integrated circuit of claim 123 wherein the memory block further comprises a plurality of read ports to read data from the memory block.

* * * * *